US012154921B2

(12) United States Patent
Uhlig et al.

(10) Patent No.: US 12,154,921 B2
(45) Date of Patent: Nov. 26, 2024

(54) IMAGE SENSOR AND DEVICE FOR AN IMAGE SENSOR

(71) Applicant: Infineon Technologies AG, Neubiberg (DE)

(72) Inventors: Ines Uhlig, Dresden (DE); Kerstin Kaemmer, Radebeul (DE); Dirk Offenberg, Dresden (DE); Norbert Thyssen, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 558 days.

(21) Appl. No.: 17/398,147

(22) Filed: Aug. 10, 2021

(65) Prior Publication Data

US 2022/0052091 A1 Feb. 17, 2022

(30) Foreign Application Priority Data

Aug. 11, 2020 (EP) .................................... 20190506

(51) Int. Cl.
*H01L 27/146* (2006.01)
*G02B 5/04* (2006.01)
*G03B 30/00* (2021.01)

(52) U.S. Cl.
CPC .......... *H01L 27/14621* (2013.01); *G02B 5/04* (2013.01); *G03B 30/00* (2021.01); *H01L 27/14625* (2013.01); *H01L 27/14636* (2013.01)

(58) Field of Classification Search
CPC ......... H01L 27/14621; H01L 27/14625; H01L 27/14636; H01L 27/1462; H01L 27/14627; H01L 27/14643; G02B 5/04; G02B 5/285; G02B 5/281; G03B 30/00
See application file for complete search history.

(56) References Cited

U.S. PATENT DOCUMENTS

| | | |
|---|---|---|
| 2005/0236653 A1 | 10/2005 | Lim |
| 2011/0278436 A1 | 11/2011 | Rhodes et al. |
| 2019/0096930 A1* | 3/2019 | Chuang ............... H01L 27/1461 |
| 2019/0121339 A1* | 4/2019 | Cella ................. G05B 19/41875 |
| 2019/0131327 A1* | 5/2019 | Chou .................. H01L 27/1464 |
| 2019/0131329 A1* | 5/2019 | Wu .................... H01L 27/14636 |
| 2019/0363125 A1 | 11/2019 | Zimmer et al. |
| 2021/0281750 A1* | 9/2021 | Vu ......................... H04N 23/55 |

* cited by examiner

*Primary Examiner* — Gevell V Selby
(74) *Attorney, Agent, or Firm* — Murphy, Bilak & Homiller, PLLC

(57) ABSTRACT

A device for an image sensor is provided. The device includes a semiconductor device having a photo-sensitive region and a metallization stack for electrically contacting the photo-sensitive region. The photo-sensitive region is configured to generate an electric signal based on incident light. Further, the device includes an optical stack formed on a surface of the semiconductor device and configured to guide the incident light towards the photo-sensitive region. The optical stack includes a plurality of regions stacked on top of each other. The plurality of regions includes a filter region configured to selectively transmit the incident light only in a target wavelength range.

18 Claims, 11 Drawing Sheets

IMAGE SENSOR AND DEVICE FOR AN IMAGE SENSOR

TECHNICAL FIELD

The present disclosure relates to a structure for image sensors. In particular, examples relate to a device for an image sensor. Further examples relate to an image sensor.

BACKGROUND

In an optical camera, light is captured by an optical sensor. The performance of such a system increases with more and more sensitive optical sensors. With increasing sensitivity, however, the susceptibility to interference from ambient light (Signal-to-Noise Ratio, SNR) also increases.

In conventional structures, an optical filter is integrated in a package with the optical sensor. The filter is only transparent to light in a wavelength range of interest. A consequence of the package solution is a large distance between the filter and the optical sensor. Further, the package solution allows light to hit the filter at large angles. This increases the amount of ambient light that can still pass through the filter to the optical sensor.

Hence, there may be a demand for improved guidance of incident light towards a photo-sensitive region.

SUMMARY

The demand may be satisfied by the subject matter of the appended claims.

An example relates to a device for an image sensor. The device comprises a semiconductor device comprising a photo-sensitive region and a metallization stack for electrically contacting the photo-sensitive region. The photo-sensitive region is configured to generate an electric signal based on incident light. Further, the device comprises an optical stack formed on a surface of the semiconductor device for guiding the incident light towards the photo-sensitive region. The optical stack comprises a plurality of regions stacked on top of each other. The plurality of regions comprise a filter region configured to selectively transmit the incident light only in a target wavelength range.

Another example relates to an image sensor for an optical camera. The image sensor comprises an array of photo-sensitive pixels. At least one photo-sensitive pixel of the array of photo-sensitive pixels comprises device as proposed herein.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
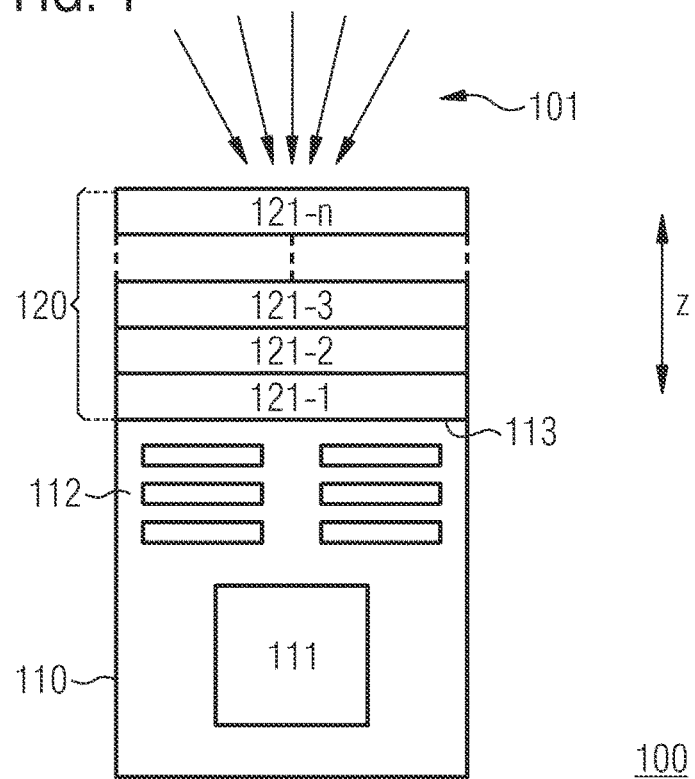
FIG. 1 illustrates a first example of a device for an image sensor.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates a device 100 for an image sensor of an optical camera. The device 100 comprises a semiconductor device 110 comprising a photo-sensitive region 111 and a metallization stack 112 for electrically contacting the photo-sensitive region 110.

The photo-sensitive region 111 is configured to generate an electric signal based on incident (incoming) light 101. The photo-sensitive region 111 emits electrons or other charge carriers based on the inner photoelectric effect when the incident light 101 hits the semiconductor material of the photo-sensitive region 111. The emitted electrons or other charge carriers cause the electric signal, which depends on the incident light 101. The photo-sensitive region 111 may be sensitive to incident light 101 of any target (desired)

wavelength range. For example, the photo-sensitive region 111 may be sensitive to one or more of infrared light, visible light or ultraviolet light. The photo-sensitive region 111 (and also other parts of the semiconductor material 112) may be made up of any desired semiconductor material such as silicon or gallium arsenide.

The metallization stack 112 comprises multiple metal layers for electrically contacting the photo-sensitive region 111. For example, the metallization stack 112 may be used to couple a read-out circuit and/or a driver circuit of the image sensor (e.g. providing a bias or modulation signal for the photo-sensitive region 111) to the photo-sensitive region 111.

For example, the photo-sensitive region 111 may be formed in semiconductor material of the semiconductor device 110 and the metallization stack 112 may be formed in a non-semiconductor of the semiconductor device 110 (such as, e.g., silicon dioxide $SiO_2$). However, the proposed device 100 is not limited thereto. In other examples, the photo-sensitive region 111 may be part of the metallization stack 112. That is, the photo-sensitive region 111 may be formed from semiconductor material within the metallization stack 112. For example, the photo-sensitive region 111 may be formed on a surface of a semiconductor wafer of the semiconductor device 110 as part of the metallization stack 112.

One or more semiconductor structures such as diodes or transistors may optionally be formed in the semiconductor material of the semiconductor device 110. In particular, the one or more semiconductor structures may be formed in or around the photo-sensitive region 111.

Further, the device 100 comprises an optical stack 120 formed (directly) on a surface of the semiconductor device 110 for guiding the incident light 101 towards the photo-sensitive region 111. In the example of FIG. 1, the optical stack 120 is formed on a front surface 113 of the semiconductor device 110. In other words, the metallization stack 112 is arranged between the photo-sensitive region 111 and the optical stack 120 along a thickness direction z of the optical stack 112. For example, the optical stack 120 may be deposited on the metallization stack 112 of a wafer of the semiconductor device 110. The device 100 may be used for front side illumination of the photo-sensitive region 111.

Figure 2:
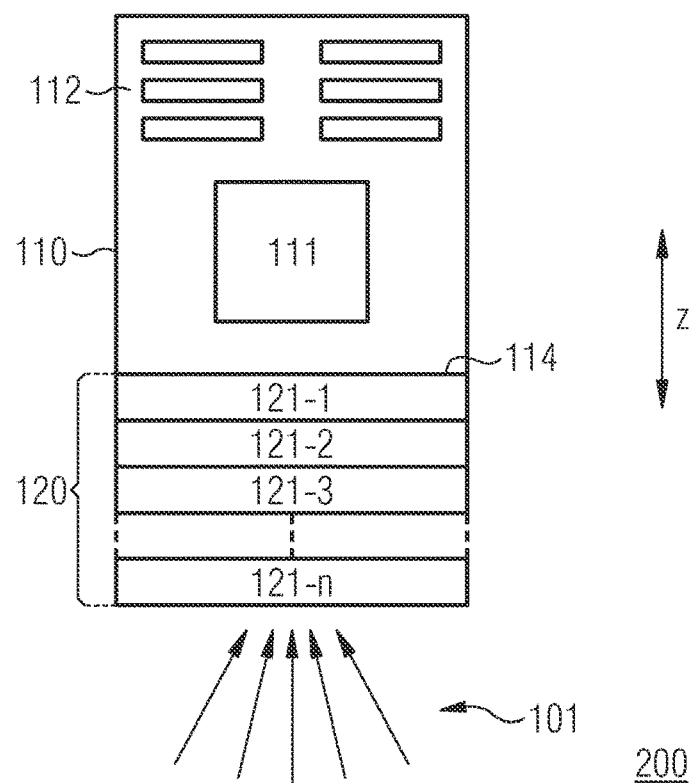
FIG. 2 illustrates a second example of a device for an image sensor.

Alternatively, the optical stack may be formed on a backside of the semiconductor device. This is illustrated in FIG. 2 showing an alternative device 200 for an image sensor. The device 200 distinguishes from the device 100 illustrated in FIG. 1 in that the optical stack 120 is formed on a back surface 114 of the semiconductor device 110. In other words, the photo-sensitive region 111 is arranged between the metallization stack 112 and the optical stack 120 along the thickness direction z of the optical stack 112. The device 200 may be used for back side illumination of the photo-sensitive region 111. For example, the optical stack 120 may be deposited on the back surface 114 of a backside-thinned wafer of the semiconductor device 110 (made of Si or another semiconductor material) over the area of the photo-sensitive region 111. For example, the wafer may be a monocrystalline wafer thinned to a thickness of 1 μm to 725 μm along the thickness direction z of the optical stack 112.

As can be seem from FIG. 1 and FIG. 2, the optical stack comprises a plurality of regions 121-1, . . . , 121-n stacked on top of each other along the thickness direction z of the optical stack 112. The plurality of regions 121-1, . . . , 121-n may comprise any number n≥2 regions. Each of the plurality of regions 121-1, . . . , 121-n may be formed from one or more layers of material. Different regions of the plurality of regions 121-1, . . . , 121-n may be formed from different materials. The plurality of regions 121-1, . . . , 121-n may serve different (optical) functions in the process of guiding the incident light 101 towards the photo-sensitive region 111. Two or more of the plurality of regions 121-1, . . . , 121-n may serve the same function in the process of guiding the incident light 101 towards the photo-sensitive region 111.

Figure 3:
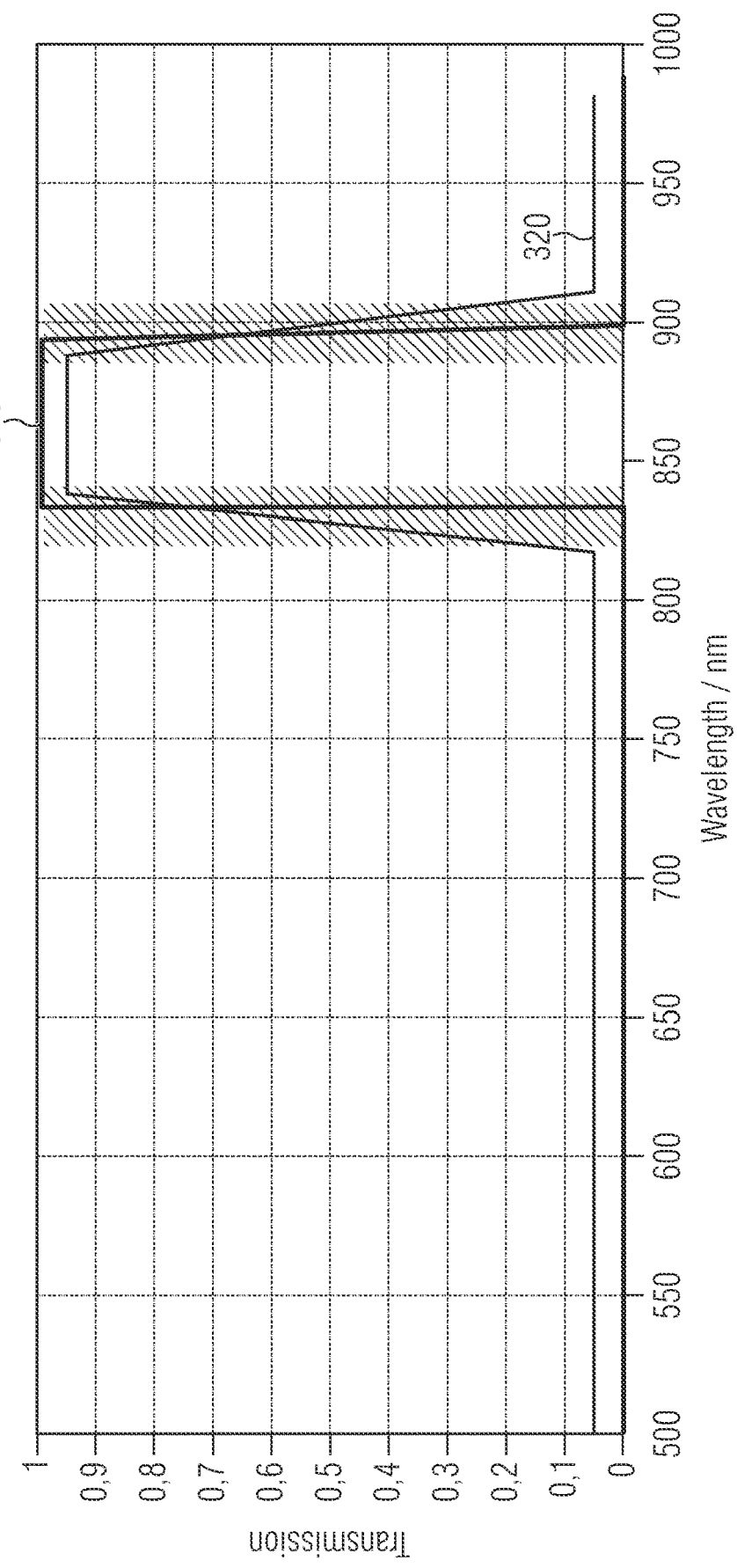
FIG. 3 illustrates exemplary transmission characteristics of a filter region.

The plurality of regions 121-1, . . . , 121-n comprise at least a filter region configured to selectively transmit the incident light 101 only in the target wavelength range (e.g. the region 121-2 may be the filter region). In other words, the filter region is configured to selectively filter (block) light portions of the incident light 101 outside the target wavelength range. This is exemplarily illustrated in FIG. 3 illustrating a first course 310 of the filter region's transmissivity and a second course 320 of the filter region's transmissivity. The abscissa denotes the wavelength of the incident light, and the ordinate denotes the transmissivity of the filter region.

The first course 310 of the filter region's transmissivity may, e.g., be a desired (target) transmission/filtering behavior (characteristic) of the filter region. In the first course 310, the filter region does not at all transmit incident light outside the target wavelength range between 830 to 900 nm. On the other hand, the filter region transmits all incident light in the target wavelength range. As can be seen from FIG. 3, the transmissivity of the filter region abruptly falls at the edges of the target wavelength range in the first course 310.

The second course 320 of the filter region's transmissivity may, e.g., be a minimum desired or required behavior (characteristic) of the filter region. In the second course 320, the filter region suppresses incident light outside the target wavelength range. However, a small amount of light (e.g. less than 5% in the example of FIG. 3) is still transmitted by the filter region. On the other hand, the filter region transmits almost all incident light in the target wavelength range (e.g. more than 95% in the example of FIG. 3). As can be seen from FIG. 3, the transmissivity of the filter region in the second course 320 falls at the edges of the target wavelength range less abruptly (i.e. with a smaller gradient) than in the first course 310.

In other words, the filter region is used to allow incident light to pass in a certain wavelength range with high transmission (e.g. 940 nm+/−25 nm with at least 95% transmissivity) and to suppress it in the other wavelength ranges (e.g. <5% transmissivity otherwise).

The filter region may, e.g., be formed as an optical interference filter or a Bragg filter. For example, the optical filter region may comprise a layer stack in which layers of materials with high and low refractive index alternate (e.g. Silicon, Si, and Silicon monoxide, SiO). In other words, the filter region may comprise a plurality of stacked layers with varying refractive indexes. A thickness of the filter region along the thickness direction z of the optical stack 112 may, e.g., be between 1 μm and 20 μm.

Since the distance between the optical stack 120 and the photo-sensitive region 111 (i.e. the optical sensor) is minimal in the devices 100 and 200, the illumination of the photo-sensitive region 111 is improved compared to conventional approaches. Further, the filter region in the optical stack allows to filter undesired light portions from the incident light 101.

Figure 4:
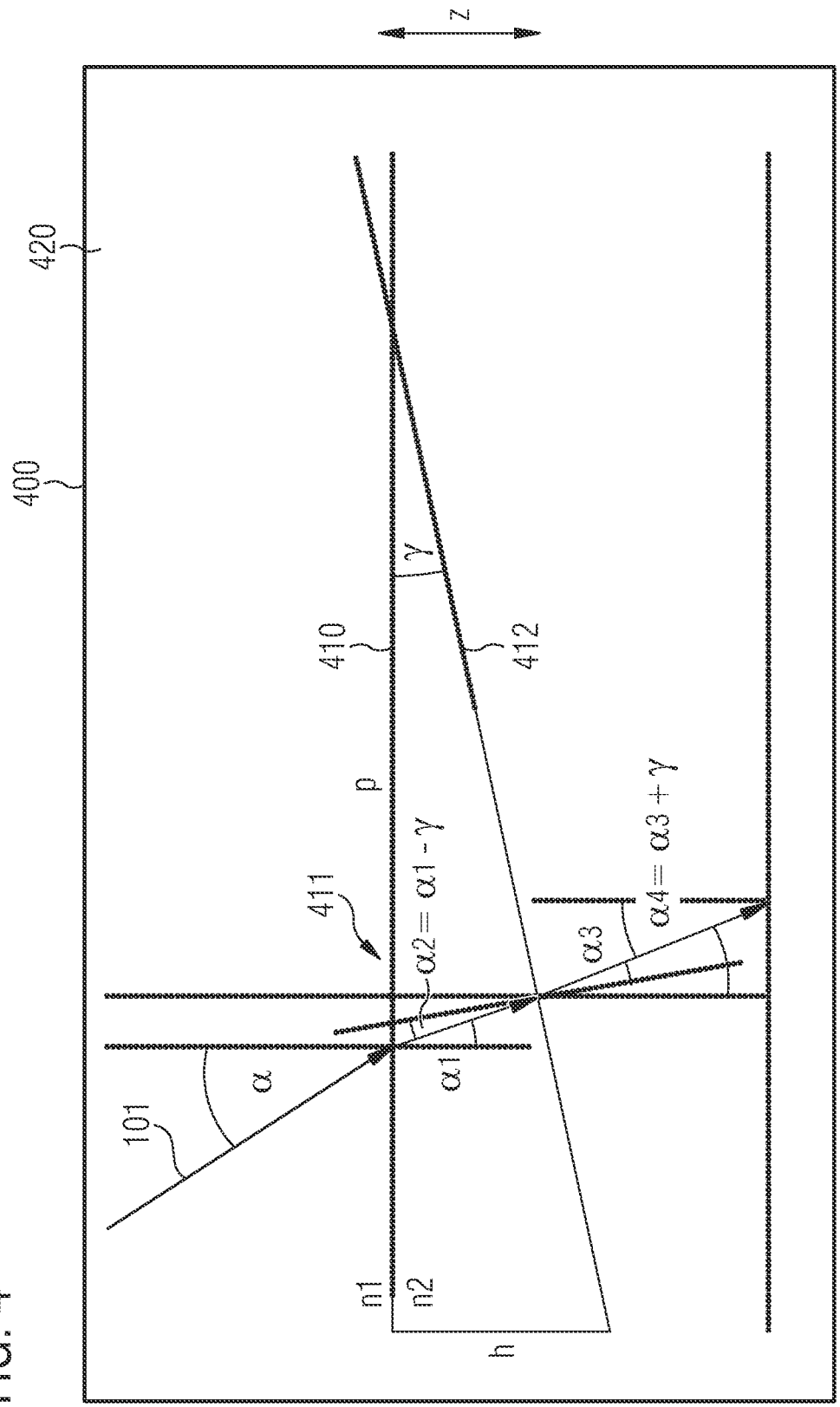
FIG. 4 illustrates a first example of a prism region.

Referring back to FIG. 1 and FIG. 2, the plurality of regions 121-1, . . . , 121-n may further comprise a prism region. For example, the region 121-3 may be the prism region. An exemplary prism region 400 is illustrated in FIG. 4. The prism region 400 comprises a prism 410 comprising a first surface 411 for receiving the incident light 101 and a second surface 412 opposite the first surface 411 and turned towards the filter region. That is, the filter region would be arranged below the prism region in the example of FIG. 4. The incident light 101 first passes through the prism region 400 before it reaches the filter region. In other words, the filter region is arranged between the prism region and the semiconductor device.

The first surface 411 and the second surface 412 are tilted by a tilt angle $\gamma$ relative to each other so as to modify a direction of propagation of the incident light 101 passing through the prism 400 to be parallel to the thickness direction z of the optical stack 120.

The prism 410 is embedded in an embedding material 420 of the prism region 400. The prism exhibits a refractive index $n_2$ and the embedding material exhibits a refractive index $n_1$. The refractive indexes $n_1$ and $n_2$ of the prism 410 and the embedding material 420 are different from each other. Embedding the prism 410 in a layer of the embedding material 420 may allow to form the prism region 400 in such a way that the prism region 400 has no topology at the top and bottom surfaces contacting neighboring regions of the optical stack 120.

In the example of FIG. 4, the first surface 411 is perpendicular to the thickness direction z of the optical stack 120, while an angle between the second surface 412 and the thickness direction z of the optical stack is 90°–$\gamma$. In other examples, the second surface 412 may be perpendicular to the thickness direction z of the optical stack 120, and an angle between the first surface 411 and the thickness direction z of the optical stack 120 may be 90°–$\gamma$.

The angle $\alpha_1$ of the received incident light 101 to the normal of the first surface 411 within the prism 410 is given as follows:

$$\sin\alpha_1 = \frac{n_1}{n_2} \cdot \sin\alpha \qquad (1)$$

The angle $\alpha$ denotes the angle of the incident light to the thickness direction z of the optical stack in the embedding material 420. The angle $\alpha_2$ of the incident light 101 to the normal of the second surface 412 within the prism 410 is given as follows:

$$\alpha_2 = \alpha_1 - \gamma \qquad (2)$$

The angle $\alpha_3$ of the outgoing incident light 101 to the normal of the second surface 412 in the embedding material 420 is given as follows:

$$\sin\alpha_3 = \frac{n_1}{n_2} \cdot \sin\alpha_2 \qquad (3)$$

The angle $\alpha_4$ of the outgoing incident light 101 to the thickness direction z of the optical stack in the embedding material 420 is given as follows:

$$\alpha_4 = \alpha_3 + \gamma \qquad (4)$$

The prism 410 is oriented such with respect to the filter region and the photo-sensitive region 111 that a uniform illumination of the photo-sensitive region 111 is achieved. The geometrical shape of the prism 410 (size, tilt angle $\gamma$) as well as the material of the prism 410 (refractive index $n_2$ vs. refractive index $n_1$ of the embedding material 420) are selected such that the underlying layers are illuminated with light rays parallel to each other and perpendicular to the surface of the semiconductor device (i.e. parallel to the thickness direction z of the optical stack).

In other words, the tilt angle $\gamma$ as well as the refractive indexes $n_1$ and $n_2$ may be selected such that $|\alpha_4|<|\alpha|$. In particular, the tilt angle $\gamma$ as well as the refractive indexes $n_1$ and $n_2$ may be selected such that $|\alpha_4|\approx 0°$.

Figure 5:
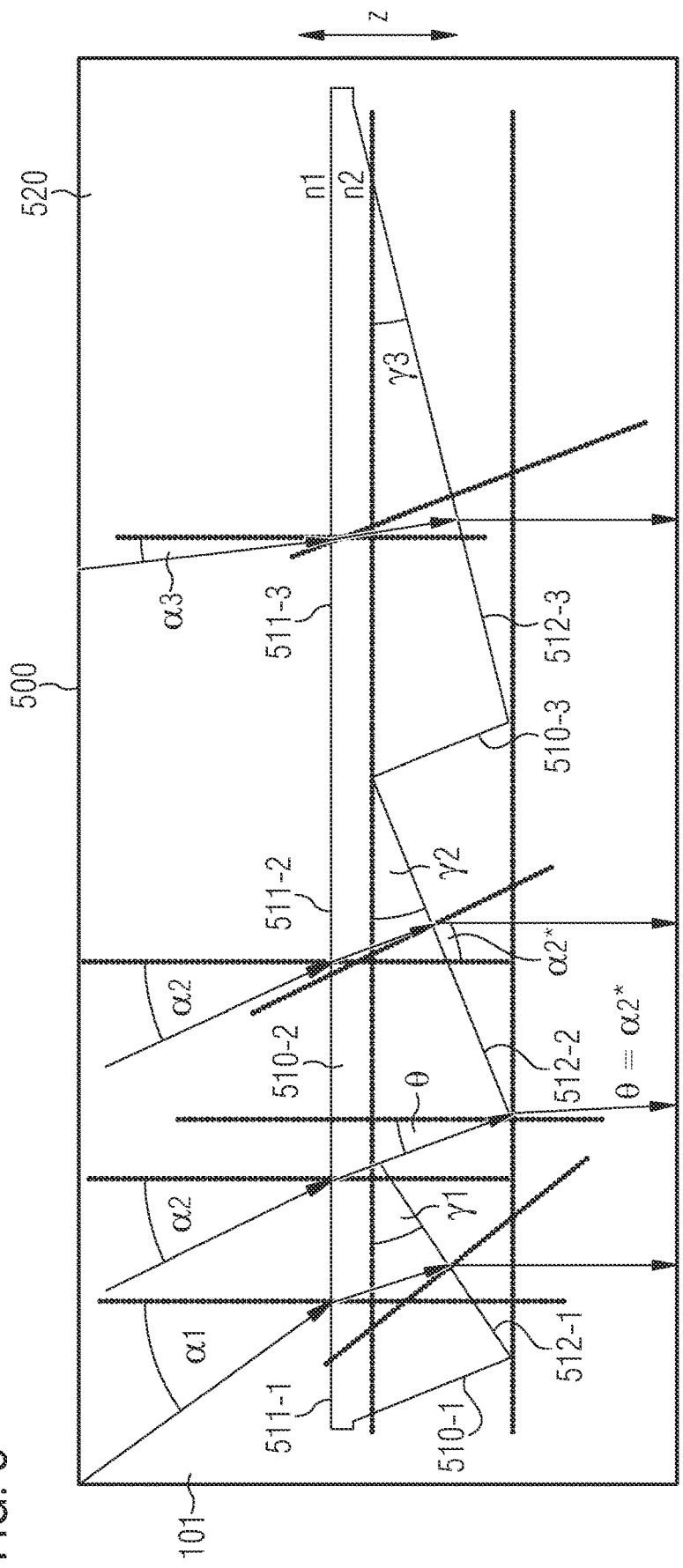
FIG. 5 illustrates a second example of a prism region.

The prism region may in some examples comprise more than one prism. In general, the prism region may comprise any number m≥1 prisms. FIG. 5 illustrates an exemplary prism region 500 comprising three prims 510-1, 510-2 and 510-3 embedded in an embedding material 520.

Similar to what is described above for the example of FIG. 4, the first prism 510-1 comprises a first surface 511-1 for receiving the incident light 101 and a second surface 512-1 opposite the first surface 511-1 and turned towards the filter region (i.e. facing the filter region). Like in the example of FIG. 4, the filter region would be arranged below the prism region 500 in the example of FIG. 5. The first surface 511-1 and the second surface 512-1 are tilted by a first tilt angle $\gamma_1$ relative to each other so as to modify a direction of propagation of the incident light 101 passing through the first prism 510-1 to be (substantially) parallel to the thickness direction z of the optical stack.

Analogously, the second prism 510-2 comprises a third surface 511-2 for receiving the incident light 101 and a fourth surface 512-2 opposite the third surface 511-2 and turned towards the filter region. The third surface 511-2 and the fourth surface 512-2 are tilted by a second tilt angle $\gamma_2$ relative to each other so as to modify a direction of propagation of the incident light 101 passing through the second prism 510-2 to be (substantially) parallel to the thickness direction z of the optical stack.

The third prism 510-3 comprises a fifth surface 511-3 for receiving the incident light 101 and a sixth surface 512-3 opposite the fifth surface 511-3 and turned towards the filter region. The fifth surface 511-3 and the sixth surface 512-3 are tilted by a third tilt angle $\gamma_3$ relative to each other so as to modify a direction of propagation of the incident light passing 101 through the third prism 510-3 to be (substantially) parallel to the thickness direction z of the optical stack.

The incident light 101 hits the first to third prisms 510-1 to 510-3 under incident angles $\alpha_1$ to $\alpha_3$, which are different from each other. By selecting the refractive index $n_2$ of the first to third prisms 510-1 to 510-3, the refractive index $n_1$ of the embedding material 520 and the respective tilt angle $\gamma_x$ of each of the first to third prisms 510-1 to 510-3, the direction of propagation of the incident light 101 passing through the respective prism 510-1, 510-2 and 510-3 may be changed to be (substantially) parallel to the thickness direction z of the optical stack. The first to third tilt angles $\gamma_1$ to $\gamma_3$ may be adjusted individually. In particular, the first to third tilt angles $\gamma_1$ to $\gamma_3$ may be different from each other.

As illustrated in FIG. 5, the prisms of the prism region may contact each other (i.e. be formed as one integral element). Alternatively, the prims of the prism regions may be distant to each other (i.e. not contact each other). Further, the prisms of the prism region may exhibit different refractive indexes contrary to what is illustrated in FIG. 5.

Using a prism region such as the prism regions 400 and 500 described above in the optical stack 120 of the devices 100 and 200 may allow to modify the direction of propagation of the incident light 101 such that the incident light 101 hits the filter region at substantially a right angle. In other words, the prism region may allow to modify the direction of propagation of the incident light 101 such that the incident light 101 is substantially perpendicular to the filter region when arriving at the filter region. If the incident light 101 hits the filter region at substantially a right angle, a narrower target wavelength range in which the filter region transmits the incident light 101 may be achieved. In other words, the prism region may ensure that only light at a very small angle (to the surface normal of the filter region) can hit the optical filter region, so that the wavelength range of transmission is ideal with respect to the specification. Due to the minimum distance between the optical stack and the photo-sensitive region, there is less interference and the illumination of the photo-sensitive region is optimal.

Referring back to FIG. 1 and FIG. 2, the plurality of regions 121-1, . . . , 121-n may further comprise a lens region. For example, the region 121-1 may be the lens region. The lens region comprises at least one lens configured to converge the incident light 101 arriving at the respective lens to a cross-sectional area smaller than that of the respective lens (the cross-sectional area is in a plane perpendicular to the thickness direction z of the optical stack 120). In other words, the respective lens focusses the incident light to a smaller cross-sectional area.

Figure 6:
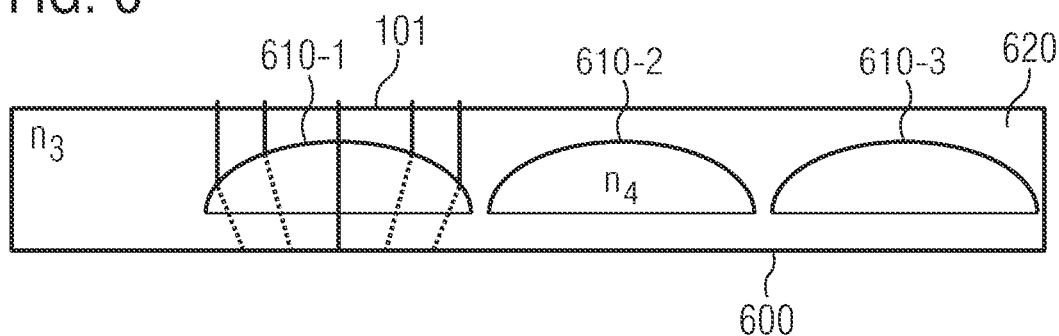
FIG. 6 illustrates an example of a lens region.

An exemplary lens region 600 is illustrated in FIG. 6. The lens region 600 comprises three lenses 610-1, 610-2 and 610-3 each configured to converge the incident light 101 arriving at the respective lens to a cross-sectional area smaller than that of the respective lens. The lenses 610-1, 610-2 and 610-3 are embedded in an embedding material 620 of the lens region 600. Refractive indexes of the embedding material 620 and the lenses 610-1, 610-2 and 610-3 are different from each other. For example, a refractive index $n_3$ of the embedding material 620 may be smaller than a refractive index $n_4$ of the lenses 610-1, 610-2 and 610-3.

As indicated in FIG. 6, the lenses 610-1, 610-2 and 610-3 may be formed as hemispherical converging lenses in a layer of the embedding material 620. Alternatively, the lenses 610-1, 610-2 and 610-3 may be formed as spherical lenses. The ratio of the refractive indexes of the lens material and the embedding material 620 may be chosen such that the lenses 610-1, 610-2 and 610-3 concentrate the incident light 101 that hits the spherical surface onto a smaller area under the flat side of the respective lens. The lens region may allow to focus the incident light 101 of upper layers of the optical stack 120 from a larger cross-sectional area to a smaller cross-sectional area (in the lower optical stack 120). The lenses may be arranged relative to the photo-sensitive region 111 such that an optimum illumination of the photo-sensitive region 111 is achieved.

The optical stack 120 may comprise one or more of the above described regions. The optical stack 120 may further comprise regions different from those described above. For example, the optical stack 120 may comprises one or more non-optical-active transition regions (or layers) which are required for producing the optical stack (e.g. a planarization region/layer). The stacking order of the various regions may vary depending on the target (desired) performance of the overall system consisting of optical stack 120 and the semiconductor device 110.

Further, the optical stack 120 may at least partly be covered with one or more films. For example, the optical stack 120 may at least partly be covered with a passivation film in order to protect the optical stack from the environment. For example, the passivation film may be a $SiO_2$ coating. However, it is to be noted that any other suitable coating may be used as well. Alternatively or additionally, the optical stack 120 may at least partly be covered with an antireflective film (coating) in order to suppress reflections of the incident light 101 at the surface of the optical stack 120. For example, the antireflective film may be a nitride coating. However, it is to be noted that any other suitable antireflective coating may be used as well.

Figure 7:
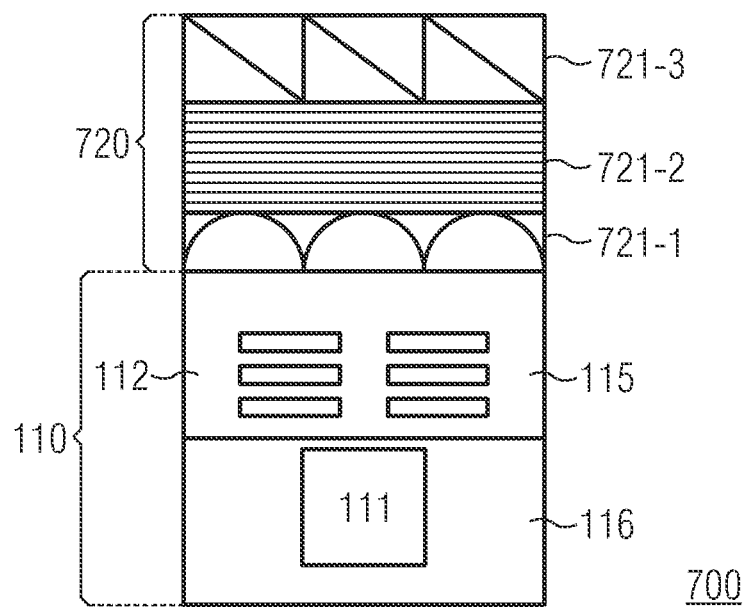
FIG. 7 illustrates a third example of a device for an image sensor.
Figure 8:
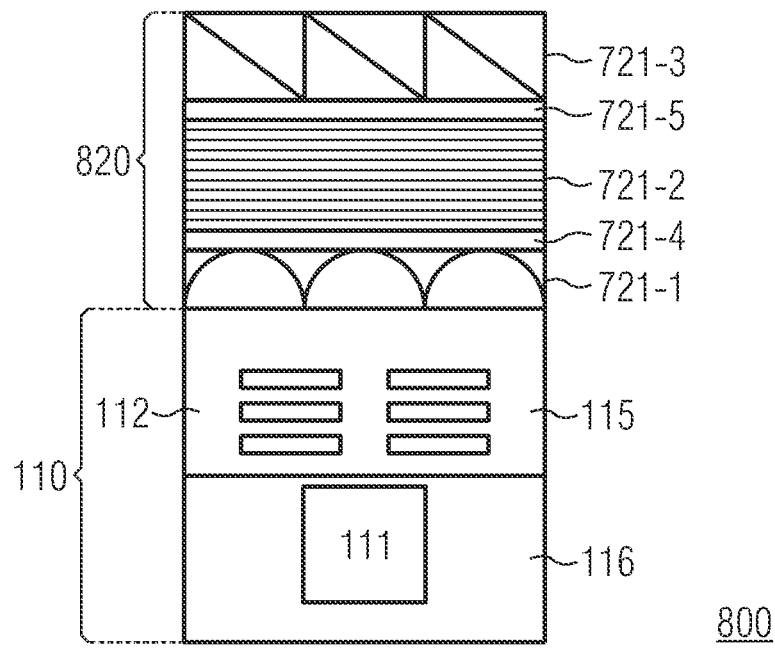
FIG. 8 illustrates a fourth example of a device for an image sensor.
Figure 9:
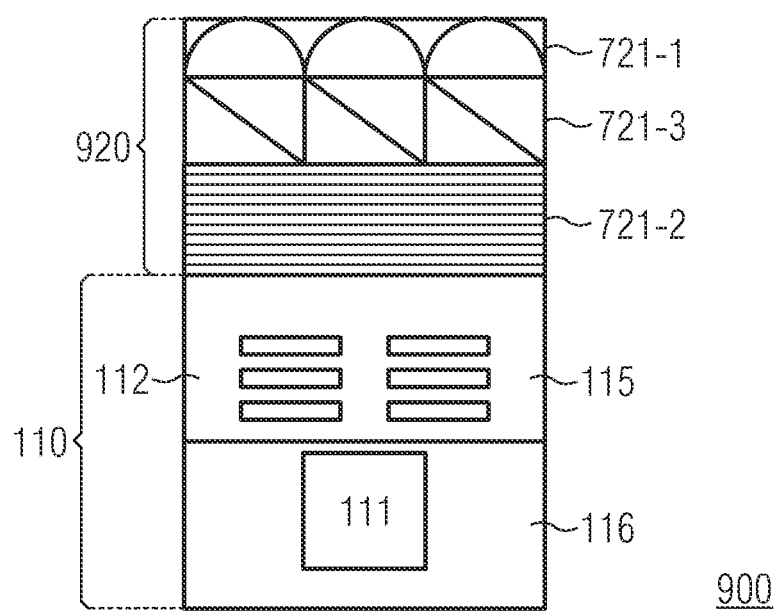
FIG. 9 illustrates a fifth example of a device for an image sensor.

In the following some exemplary stacking orders of the various regions in the proposed optical stack will be described with reference to FIGS. 7 to 13. FIGS. 7 to 9 show exemplary devices for an image sensor for front side illumination, whereas FIGS. 10 to 13 show exemplary devices for an image sensor for back side illumination. In the following, only the stacking order of the various layers within the respective optical stack will be highlighted. The characteristics/internal structure of the individual region are/is as explained above with respect to FIGS. 1 to 6. Analogously, the characteristics/internal structure of the semiconductor device are/is as explained above with respect to FIGS. 1 to 6. In particular, the photo-sensitive region 111 is formed in semiconductor material 116 of the semiconductor device 110, whereas the metallization stack 112 is formed in a non-semiconductor material (e.g. $SiO_2$) of the semiconductor device 110 in the examples of FIGS. 7 to 13.

In FIG. 7, the optical stack 720 comprises a lens region 721-1, a filter region 721-2 and a prism region 721-3. In the example of FIG. 7, the filter region 721-2 and the prism region 721-3 immediately succeed one another in the optical stack 720. Further, the filter region 721-2 and the lens region 721-1 immediately succeed one another in the optical stack 720. The lens region 721-1 is closest to the photo-sensitive region 111 formed in the semiconductor material 116 of the semiconductor device 110. In other words, the filter region 721-2 is arranged between the prism region 721-3 and the photo-sensitive region 111. Further, the lens region 721-1 is arranged between the filter region 721-2 and the photo-sensitive region 111.

In the optical stack 820 illustrated in FIG. 8, the filter region 721-2 and the prism region 721-3 are separated by an intermediate region 721-4 in the optical stack 820. The intermediate region 721-5 is transparent for the incident light. Similarly, the filter region 721-2 and the lens region 721-1 are separated by an intermediate region 721-5 in the optical stack 820. Also the intermediate region 721-5 is transparent for the incident light. The intermediate regions 721-4 and 721-5 may, e.g., be planarization layers or other non-optical-active regions. The lens region 721-1 is again closest to the photo-sensitive region 111 formed in the semiconductor material 116 of the semiconductor device 110. Again, the filter region 721-2 is arranged between the prism region 721-3 and the photo-sensitive region 111. Further, the lens region 721-1 is arranged between the filter region 721-2 and the photo-sensitive region 111.

In the example of FIG. 9, the filter region 721-2 and the prism region 721-3 immediately succeed one another in the optical stack 720. Further, the prism region 721-3 and the lens region 721-1 immediately succeed one another in the optical stack 920. Compared to the example of FIG. 7, the lens region 721-1 is now the topmost region of the optical stack instead of the lower most region. In other words, the prism region 721-3 is arranged between the lens region 721-1 and the photo-sensitive region 111. Further, the filter region 721-2 is arranged between the prism region 721-3 and the photo-sensitive region 111.

It is to be noted that in alternative examples, a respective intermediate region, which is transparent for the incident light, may be formed between the lens region 721-1, the filter region 721-2 and the prism region 721-3. For example, filter region 721-2 and the prism region 721-3 may be separated by an intermediate region in the optical stack. Similarly, the prism region 721-3 and the lens region 721-1 may be separated by an intermediate region in the optical stack.

While the examples of FIGS. 7 to 9 focused on front side illumination implementations such that the metallization stack 112 is arranged between the photo-sensitive region 111 and the respective optical stack, the examples of FIGS. 10 to 13 focus on back side illumination implementations such the photo-sensitive region 111 is arranged between the metallization stack 112 and the respective optical stack.

Figure 10:
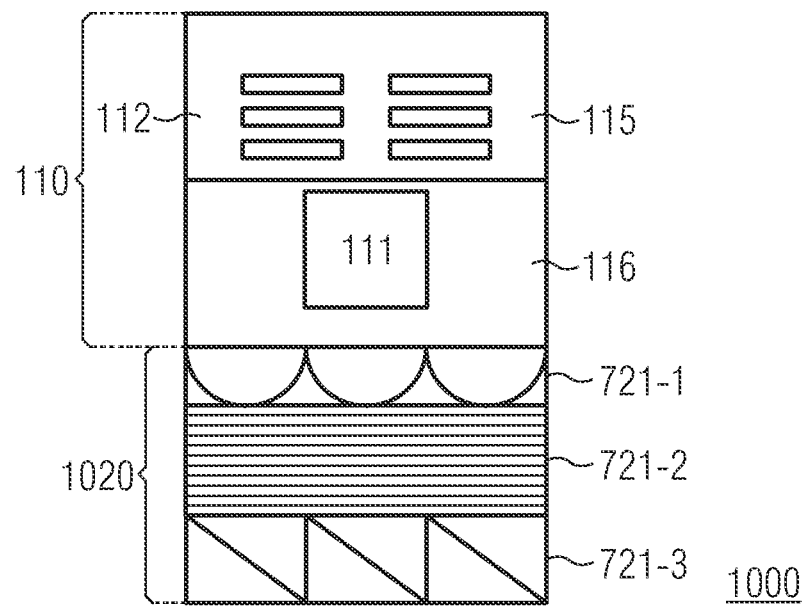
FIG. 10 illustrates a sixth example of a device for an image sensor.

In the example of FIG. 10, the filter region 721-2 and the prism region 721-3 immediately succeed one another in the optical stack 1020. Further, the filter region 721-2 and the lens region 721-1 immediately succeed one another in the optical stack 1020. The lens region 721-1 is closest to the photo-sensitive region 111 formed in the semiconductor material 116 of the semiconductor device 110. In other words, the filter region 721-2 is arranged between the prism region 721-3 and the photo-sensitive region 111. Further, the lens region 721-1 is arranged between the filter region 721-2 and the photo-sensitive region 111.

Figure 11:
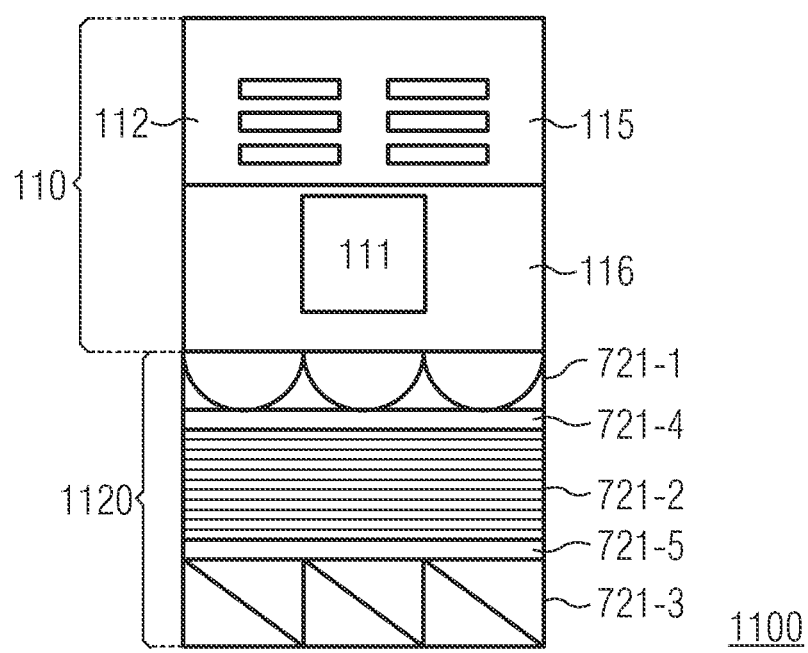
FIG. 11 illustrates a seventh example of a device for an image sensor.

In the optical stack 1020 illustrated in FIG. 11, the filter region 721-2 and the prism region 721-3 are separated by an intermediate region 721-5 in the optical stack 1120. The intermediate region 721-5 is transparent for the incident light. Similarly, the filter region 721-2 and the lens region 721-1 are separated by an intermediate region 721-4 in the optical stack 1120. Also the intermediate region 721-4 is transparent for the incident light. The intermediate regions 721-4 and 721-5 may, e.g., be planarization layers or other non-optical-active regions. Again, the lens region 721-1 is closest to the photo-sensitive region 111 formed in the semiconductor material 116 of the semiconductor device 110. The filter region 721-2 is arranged between the prism region 721-3 and the photo-sensitive region 111. Further, the lens region 721-1 is arranged between the filter region 721-2 and the photo-sensitive region 111.

Figure 12:
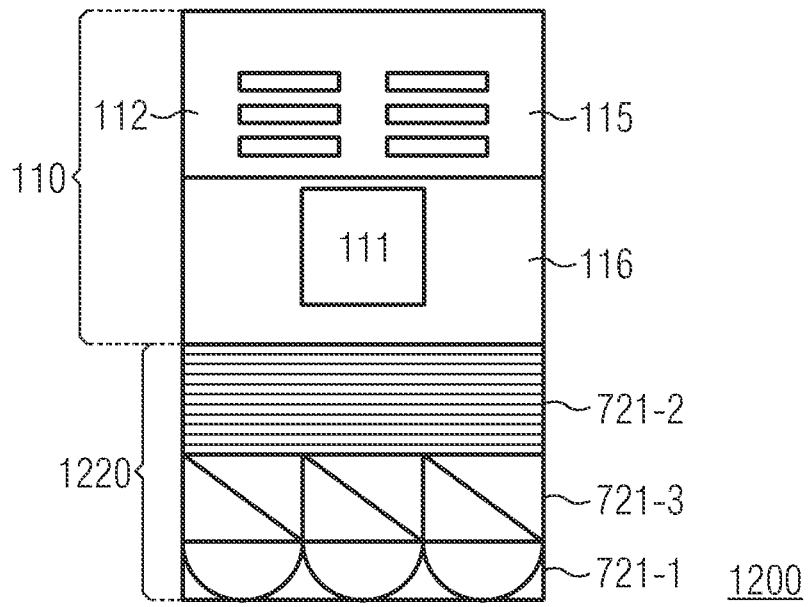
FIG. 12 illustrates an eighth example of a device for an image sensor.

In the example of FIG. 12, the filter region 721-2 and the prism region 721-3 immediately succeed one another in the optical stack 1220. Further, the prism region 721-3 and the lens region 721-1 immediately succeed one another in the optical stack 1220. Compared to the example of FIG. 10, the lens region 721-1 is now the lower most region of the optical stack instead of the topmost region. In other words, the prism region 721-3 is arranged between the lens region 721-1 and the photo-sensitive region 111. Further, the filter region 721-2 is arranged between the prism region 721-3 and the photo-sensitive region 111.

Figure 13:
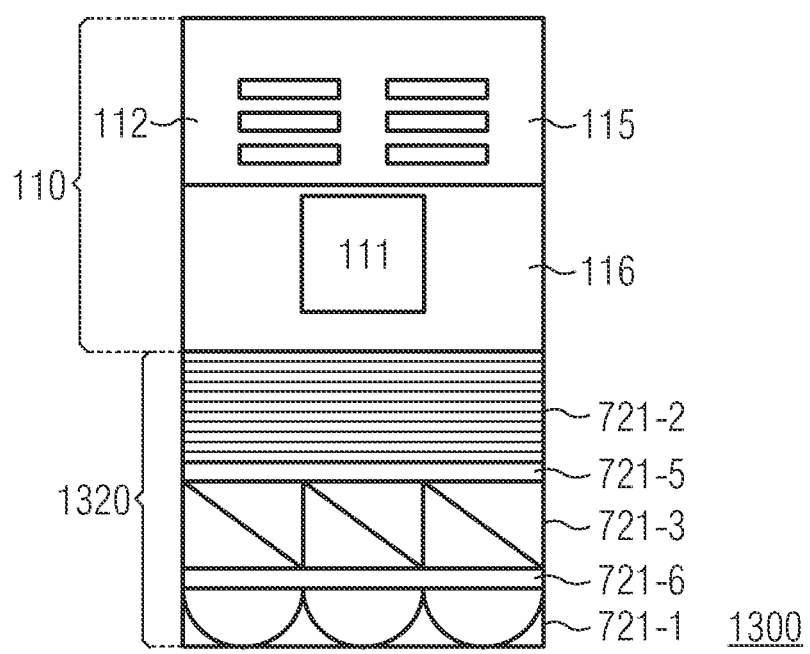
FIG. 13 illustrates a ninth example of a device for an image sensor.

In FIG. 13, the filter region 721-2 and the prism region 721-3 are separated by an intermediate region 721-5 in the optical stack. Similarly, the prism region 721-3 and the lens region 721-1 are separated by an intermediate region 721-6 in the optical stack 1320. The filter region 721-2 is closest to the photo-sensitive region 111 formed in the semiconductor material 116 of the semiconductor device 110. Again, the prism region 721-3 is arranged between the lens region 721-1 and the photo-sensitive region 111. Further, the filter region 721-2 is arranged between the prism region 721-3 and the photo-sensitive region 111.

It is to be noted that according to some examples also more than one intermediate region may be arranged between respective pairs of the lens region 721-1, the filter region 721-2 and the prism region 721-3.

In each of the examples illustrated in FIGS. 7 to 13, the filter region 721-2 is arranged between the prism region 721-3 and the semiconductor device 111 such that the direction of propagation of the incident light is modified by the prism region 721-3 to be substantially perpendicular to the surface of the filter region 721-1 (i.e. substantially parallel to the thickness direction z of the respective optical stack) before reaching the filter region 721-2. Accordingly, the incident light hits the surface of the filter region 721-1 at substantially a right angle, thus improving the filtering functionality of the filter region 721-1.

Figure 14:
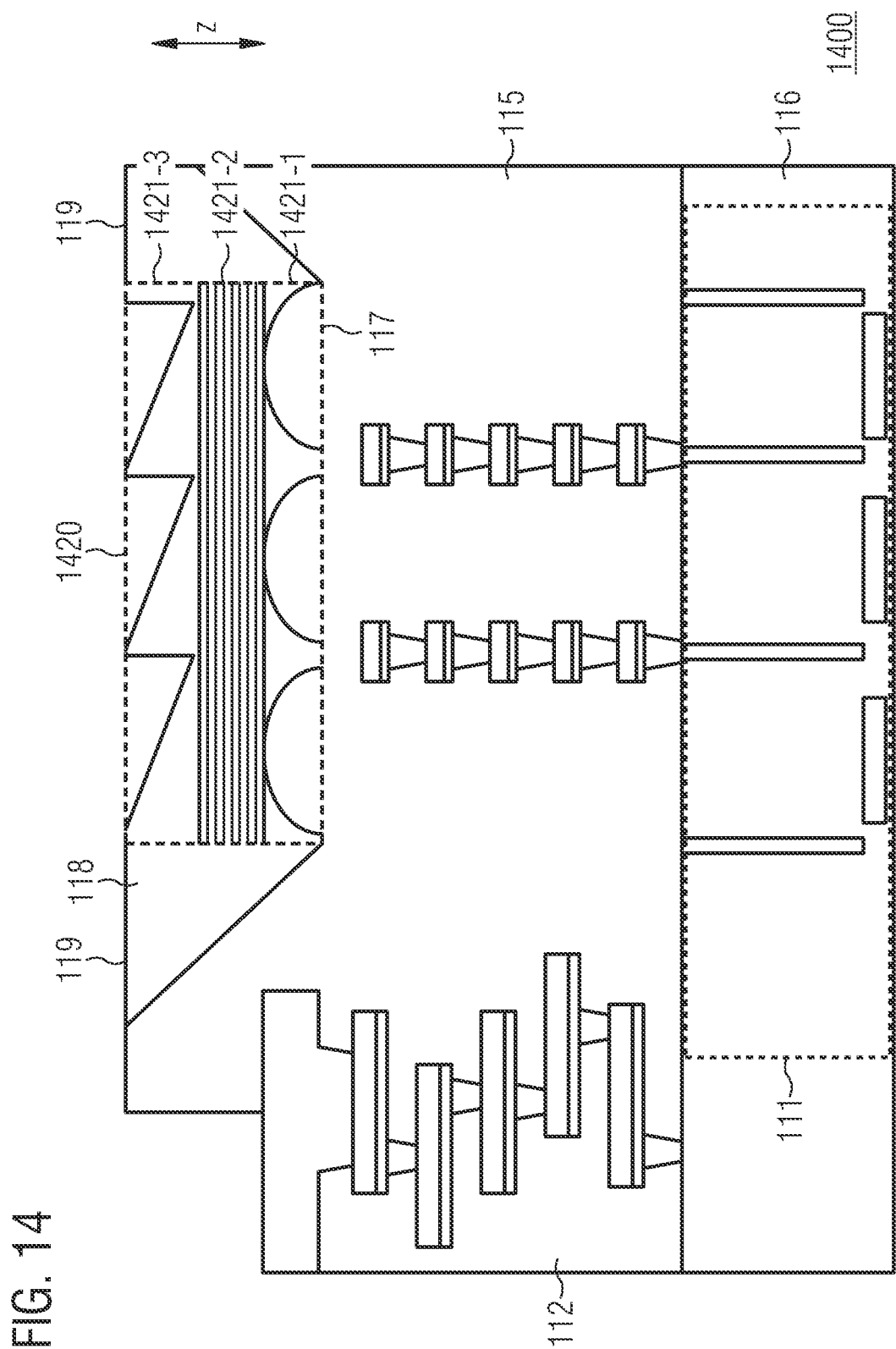
FIG. 14 illustrates a tenth example of a device for an image sensor.

FIG. 14 illustrates another example of a device 1400 for an image sensor. The device 1400 is similar to the device 100 described above. The main difference between the device 1400 and the device 100 is that the optical stack 1420 of the device 1400 is embedded in the metallization stack 120. In particular, a recess 118 is formed the non-semiconductor material 115 of the metallization stack 112. The optical stack 1420 is formed on the surface 117 of the recess 118 such that the optical stack 1420 is embedded in the metallization stack 112. Further, the recess 118 is partly filled with embedding material 119 in order to embed the optical stack 1420 in the metallization stack 112. Accordingly, the optical stack 1420 does not protrude from the metallization stack 112 along the thickness direction z of the optical stack 1420.

Considering FIG. 1 and FIG. 14, the optical stack of a device according to the proposed architecture may be arranged on a metallization stack of a semiconductor device or be embedded in the metallization stack of a semiconductor device such that the optical stack is arranged over the photo-sensitive region of the semiconductor device.

In the example of FIG. 14, the filter region 1421-2 and the prism region 1421-3 immediately succeed one another in the optical stack 1420. Further, the filter region 421-2 and the lens region 1421-1 immediately succeed one another in the optical stack 1420. The lens region 1421-1 is closest to the photo-sensitive region 111 formed in the semiconductor material 116 of the semiconductor device 110.

Figure 15:
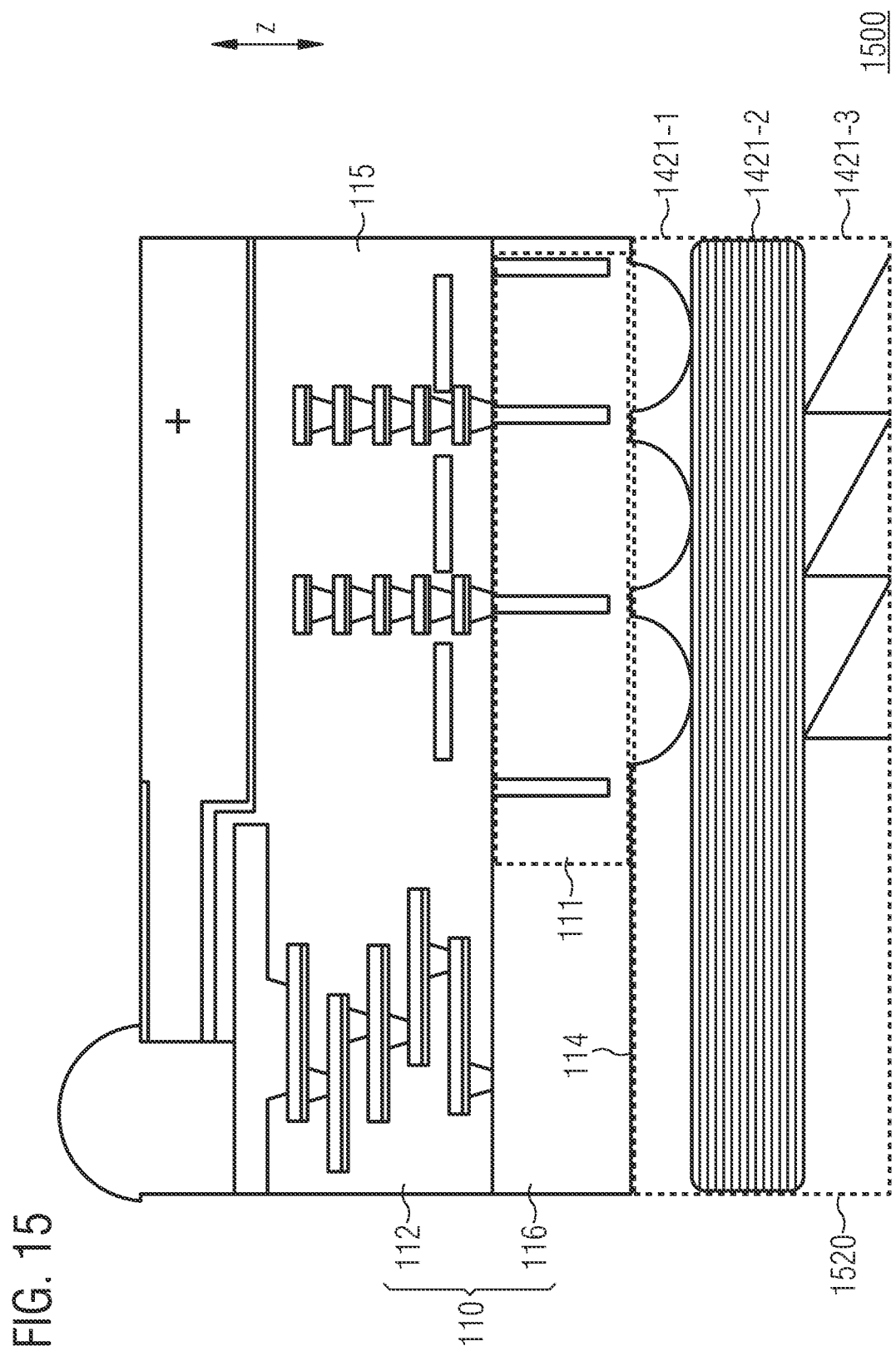
FIG. 15 illustrates an eleventh example of a device for an image sensor.

FIG. 15 illustrates another device 1500 for backside illumination. In the example of FIG. 15, the optical stack 1520 is formed on the back surface 114 of the semiconductor device 110. Again, the filter region 1421-2 and the prism region 1421-3 immediately succeed one another in the optical stack 1420. Further, the filter region 421-2 and the lens region 1421-1 immediately succeed one another in the optical stack 1420. The lens region 1421-1 is closest to the photo-sensitive region 111 formed in the semiconductor material 116 of the semiconductor device 110.

In the above examples, an optical stack with improved ambient light robustness is provided directly on a semiconductor device holding optical sensors (such as the photo-sensitive region). The above examples may, hence, provide improved ambient light robustness for optical sensors because of an optimized optical stack.

Figure 16:
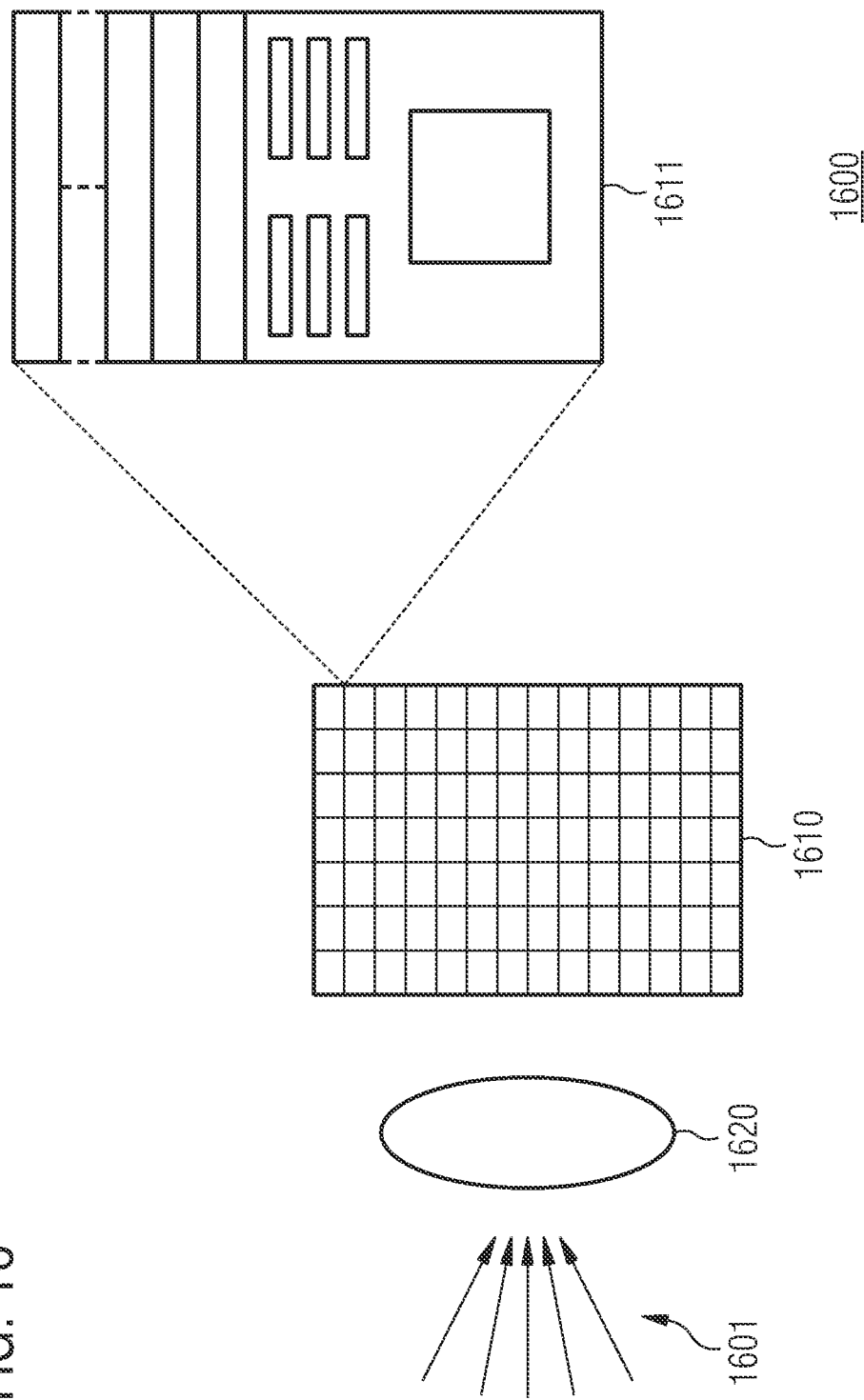
FIG. 16 illustrates an example of an optical camera.

A schematic example of an optical camera 1600 using the proposed technology is illustrated in FIG. 16. The optical camera 1600 comprises an image sensor 1610. The image sensor 1610 comprises an array of photo-sensitive pixels (elements). At least one photo-sensitive pixel of the array of photo-sensitive pixels comprises a device 1611 with a semiconductor device and an optical stack according to the proposed technology (e.g. according to one or more of the examples described above). According to some examples, each pixel of the array of photo-sensitive pixels may comprises a respective device according to the proposed technology.

Additionally, the optical camera comprises an objective with at least one objective lens 1620 configured to focus incident light 1601 on the image sensor 1610. The objective may comprise further objective lenses for focusing the incident light 1601 on the image sensor 1610.

The optical camera 1600 may further comprise other hardware—conventional and/or custom. For example, the optical camera 1600 may comprises circuitry for processing the electric signals output by the photo-sensitive regions of the individual pixels of the image sensor 1610, or circuitry for driving (e.g. biasing or gating) the individual pixels of the image sensor 1610.

The optical camera 1600 may be used for any kind of two-dimensional or three-dimensional image capturing. For example, the image sensor 1610 may be a two-dimensional imager for visible or infrared light. In other examples, the image sensor 1610 may be a three-dimensional imager for time-of-flight measurements. In case, the optical camera 1600 is a time-of-flight camera, the target wavelength range for photo-sensitive region of a pixel and the corresponding filter region of the optical stack may, e.g., be between 830 nm and 1600 nm or any subrange thereof (e.g. 940 nm+/−25 nm).

The image sensor 1610 as well as the optical camera 1600 may exhibit an improved ambient light robustness due to the optimized optical stack according to the proposed technology.

The examples as described herein may be summarized as follows:

Some examples relate to a device for an image sensor. The device comprises a semiconductor device comprising a photo-sensitive region and a metallization stack for electrically contacting the photo-sensitive region. The photo-sensitive region is configured to generate an electric signal based on incident light. Further, the device comprises an optical stack formed on a surface of the semiconductor device for guiding the incident light towards the photo-sensitive region. The optical stack comprises a plurality of regions stacked on top of each other. The plurality of regions comprise a filter region configured to selectively transmit the incident light only in a target wavelength range.

In some examples, the filter region comprises a plurality of stacked layers with varying refractive indexes.

According to some examples, the plurality of regions comprise a prism region, wherein the prism region comprises at least a first prism comprising a first surface for receiving the incident light and a second surface opposite the first surface and turned towards the filter region, wherein the first surface and the second surface are tilted by a first tilt angle relative to each other so as to modify a direction of propagation of the incident light passing through the first prism to be parallel to a thickness direction of the optical stack.

In some examples, the prism region further comprises a second prism comprising a third surface for receiving the incident light and a fourth surface opposite the third surface and turned towards the filter region, wherein the third surface and the fourth surface are tilted by a second tilt angle relative to each other so as to modify a direction of propagation of the incident light passing through the second prism to be parallel to the thickness direction of the optical stack, wherein the first tilt angle is different from the second tilt angle.

According to some examples, the first prism is embedded in an embedding material of the prism region, wherein refractive indexes of the first prism and the embedding material are different from each other.

In some examples, the filter region is arranged between the prism region and the semiconductor device.

According to some examples, the filter region and the prism region immediately succeed one another in the optical stack.

In alternative examples, the filter region and the prism region are separated by an intermediate region in the optical stack, wherein the intermediate region is transparent for the incident light.

According to some examples, the plurality of regions comprise a lens region, wherein the lens region comprises at least one lens configured to converge the incident light arriving at the respective lens to a cross-sectional area smaller than that of the respective lens.

In some examples, the at least one lens is embedded in an embedding material of the lens region, wherein refractive indexes of the at least one lens and the embedding material are different from each other.

According to some examples, the filter region and the lens region immediately succeed one another in the optical stack.

In alternative examples, the filter region and the lens region are separated by an intermediate region in the optical stack, wherein the intermediate region is transparent for the incident light.

According to some examples, the prism region and the lens region immediately succeed one another in the optical stack.

In alternative examples, the prism region and the lens region are separated by an intermediate region in the optical stack, wherein the intermediate region is transparent for the incident light.

According to some examples, the optical stack is at least partly covered with at least one of a passivation film and an antireflective film.

In some examples, the metallization stack is arranged between the photo-sensitive region and the optical stack.

According to some examples, the surface of the semiconductor device is a surface of a recess formed in the metallization stack such that the optical stack is embedded in the metallization stack.

In some examples, the photo-sensitive region is arranged between the metallization stack and the optical stack.

Other examples relate to an image sensor for an optical camera. The image sensor comprises an array of photo-sensitive pixels. At least one photo-sensitive pixel of the array of photo-sensitive pixels comprises device as proposed herein.

According to some examples, the image sensor is an image sensor for a time-of-flight camera, wherein boundaries of the target wavelength range are between 830 nm and 1600 nm.

Examples according to the proposed technology may provide improved ambient light robustness for optical sensors because of an optimized optical stack.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A device for an image sensor, comprising:
a semiconductor device comprising a photo-sensitive region and a metallization stack for electrically contacting the photo-sensitive region, wherein the photo-sensitive region is configured to generate an electric signal based on incident light; and
an optical stack formed on a surface of the semiconductor device and configured to guide the incident light towards the photo-sensitive region, wherein the optical stack comprises a plurality of regions stacked on top of each other, wherein the plurality of regions comprises a filter region configured to selectively transmit the incident light only in a target wavelength range,
wherein the filter region comprises a plurality of stacked layers with varying refractive indexes,
wherein the surface of the semiconductor device is a surface of a recess formed in the metallization stack such that the optical stack is embedded in the metallization stack.

2. The device of claim 1, wherein the plurality of regions comprises a prism region, wherein the prism region comprises at least a first prism comprising a first surface for receiving the incident light and a second surface opposite the first surface and turned towards the filter region, and wherein the first surface and the second surface are tilted by a first tilt angle relative to each other so as to modify a direction of propagation of the incident light passing through the first prism to be parallel to a thickness direction of the optical stack.

3. The device of claim 2, wherein the filter region is arranged between the prism region and the semiconductor device.

4. The device of claim 2, wherein the filter region and the prism region immediately succeed one another in the optical stack.

5. The device of claim 2, wherein the filter region and the prism region are separated by an intermediate region in the optical stack, and wherein the intermediate region is transparent for the incident light.

6. The device of claim 1, wherein the plurality of regions comprises a lens region, wherein the lens region comprises at least one lens configured to converge the incident light arriving at the respective lens to a cross-sectional area smaller than that of the respective lens.

7. The device of claim 6, wherein the filter region and the lens region immediately succeed one another in the optical stack.

8. The device of claim 6, wherein the filter region and the lens region are separated by an intermediate region in the optical stack, and wherein the intermediate region is transparent for the incident light.

9. The device of claim 6, wherein the plurality of regions comprises a prism region, wherein the prism region comprises at least a first prism comprising a first surface for receiving the incident light and a second surface opposite the first surface and turned towards the filter region, wherein the first surface and the second surface are tilted by a first tilt angle relative to each other so as to modify a direction of propagation of the incident light passing through the first prism to be parallel to a thickness direction of the optical stack, and wherein the prism region and the lens region immediately succeed one another in the optical stack.

10. The device of claim 6, wherein the plurality of regions comprises a prism region, wherein the prism region comprises at least a first prism comprising a first surface for receiving the incident light and a second surface opposite the first surface and turned towards the filter region, wherein the first surface and the second surface are tilted by a first tilt angle relative to each other so as to modify a direction of propagation of the incident light passing through the first prism to be parallel to a thickness direction of the optical stack, wherein the prism region and the lens region are separated by an intermediate region in the optical stack, and wherein the intermediate region is transparent for the incident light.

11. The device of claim 1, wherein the metallization stack is arranged between the photo-sensitive region and the optical stack.

12. An image sensor for an optical camera, wherein the image sensor comprises an array of photo-sensitive pixels, and wherein at least one photo-sensitive pixel of the array of photo-sensitive pixels comprises the device of claim 1.

13. A device for an image sensor, comprising:
a semiconductor device comprising a photo-sensitive region and a metallization stack for electrically contacting the photo-sensitive region, wherein the photo-sensitive region is configured to generate an electric signal based on incident light; and
an optical stack formed on a surface of the semiconductor device and configured to guide the incident light towards the photo-sensitive region, wherein the optical stack comprises a plurality of regions stacked on top of each other,
wherein the plurality of regions comprises a filter region configured to selectively transmit the incident light only in a target wavelength range,
wherein the plurality of regions comprises a prism region, wherein the prism region comprises at least a first prism comprising a first surface for receiving the incident light and a second surface opposite the first surface and turned towards the filter region, and wherein the first surface and the second surface are tilted by a first tilt angle relative to each other so as to modify a direction of propagation of the incident light passing through the first prism to be parallel to a thickness direction of the optical stack, and
wherein the filter region is arranged between the prism region and the semiconductor device.

14. The device of claim 13, wherein the filter region comprises a plurality of stacked layers with varying refractive indexes.

15. The device of claim 13, wherein the filter region and the prism region immediately succeed one another in the optical stack.

16. The device of claim 13, wherein the filter region and the prism region are separated by an intermediate region in the optical stack, and wherein the intermediate region is transparent for the incident light.

17. A device for an image sensor, comprising:
- a semiconductor device comprising a photo-sensitive region and a metallization stack for electrically contacting the photo-sensitive region, wherein the photo-sensitive region is configured to generate an electric signal based on incident light; and
- an optical stack formed on a surface of the semiconductor device and configured to guide the incident light towards the photo-sensitive region, wherein the optical stack comprises a plurality of regions stacked on top of each other, wherein the plurality of regions comprises a filter region configured to selectively transmit the incident light only in a target wavelength range,
- wherein the metallization stack is arranged between the photo-sensitive region and the optical stack.

18. The device of claim 17, wherein the filter region comprises a plurality of stacked layers with varying refractive indexes.

\* \* \* \* \*